(12) United States Patent
Choi et al.

(10) Patent No.: US 10,767,030 B2
(45) Date of Patent: Sep. 8, 2020

(54) OPTICAL ARTICLE AND OPTICAL FILTER COMPRISING SAME

(71) Applicant: LMS Co., Ltd., Pyeongtaek-si, Gyeonggi-do (KR)

(72) Inventors: Jeong Og Choi, Seoul (KR); Joon Ho Jung, Hwaseong-si (KR); Jin Ho Jung, Seoul (KR); Joo Young Kim, Suwon-si (KR); Seon Ho Yang, Seoul (KR)

(73) Assignee: LMS Co., Ltd., Pyeongtaek-si, Gyeonggi-do ( * ) Notice: Subject to any disclaimer, the term of this patent is extended or adjusted under 35 U.S.C. 154(b) by 240 days.

(21) Appl. No.: 16/078,728

(22) PCT Filed: Feb. 16, 2017

(86) PCT No.: PCT/KR2017/001688
§ 371 (c)(1),
(2) Date: Aug. 22, 2018

(87) PCT Pub. No.: WO2017/146413
PCT Pub. Date: Aug. 31, 2017

(65) Prior Publication Data
US 2019/0055375 A1 Feb. 21, 2019

(30) Foreign Application Priority Data

Feb. 24, 2016 (KR) .................... 10-2016-0021622
Jan. 16, 2017 (KR) .................... 10-2017-0007027

(51) Int. Cl.
*C08K 5/01* (2006.01)
*C08L 101/00* (2006.01)
(Continued)

(52) U.S. Cl.
CPC .............. *C08K 5/01* (2013.01); *C08K 5/0041* (2013.01); *C08L 101/00* (2013.01); *G02B 5/208* (2013.01);
(Continued)

(58) Field of Classification Search
CPC ........... C08K 5/01; C08L 101/00; G02B 5/26; G02B 5/208; H01L 27/14621
See application file for complete search history.

(56) References Cited

U.S. PATENT DOCUMENTS

2014/0091419 A1* 4/2014 Hasegawa .............. G02B 5/282
257/432

FOREIGN PATENT DOCUMENTS

KR    10-2014-0041528 A    4/2014
KR    10-2014-0088559 A    7/2014
(Continued)

OTHER PUBLICATIONS

International Search Report and Written Opinion with English Translation dated May 15, 2017 issued in International Application No. PCT/KR2017/001688, 10 Pages.

*Primary Examiner* — Bijan Ahvazi
(74) *Attorney, Agent, or Firm* — Polsinelli PC

(57) ABSTRACT

The present invention relates to an optical article and an optical filter comprising the same. The optical filter comprises an optical article containing one or more near-infrared absorbing dyes and having two or more absorption peaks comprising a first absorption peak and a second absorption peak in a wavelength range of 380 nm to 1,200 nm whereby the optical filter has advantages in that transmissivity is high with respect to light having the wavelength of a visible light region and transmissivity is suppressed to 0.6% or less with respect to light having a wavelength in the range of 800 nm to 1,000 nm so that ghost image problems can be prevented, (Continued)

and a yield and productivity can be improved through the reduction of poor assembly caused by the bending of the optical filter in an image device assembling process.

12 Claims, 10 Drawing Sheets

(51) Int. Cl.
  *G02B 5/20* (2006.01)
  *G02B 5/26* (2006.01)
  *H01L 27/146* (2006.01)
  *G02B 5/22* (2006.01)
  *C08K 5/00* (2006.01)

(52) U.S. Cl.
  CPC ........ *G02B 5/223* (2013.01); *H01L 27/14621* (2013.01); *C08K 5/0091* (2013.01); *G02B 5/26* (2013.01)

(56) References Cited

FOREIGN PATENT DOCUMENTS

| KR | 10-1553469 A | 10/2014 |
|----|--------------|---------|
| KR | 10-1474902 A | 12/2014 |
| KR | 10-2015-0046016 A | 4/2015 |

* cited by examiner

[FIG. 1]
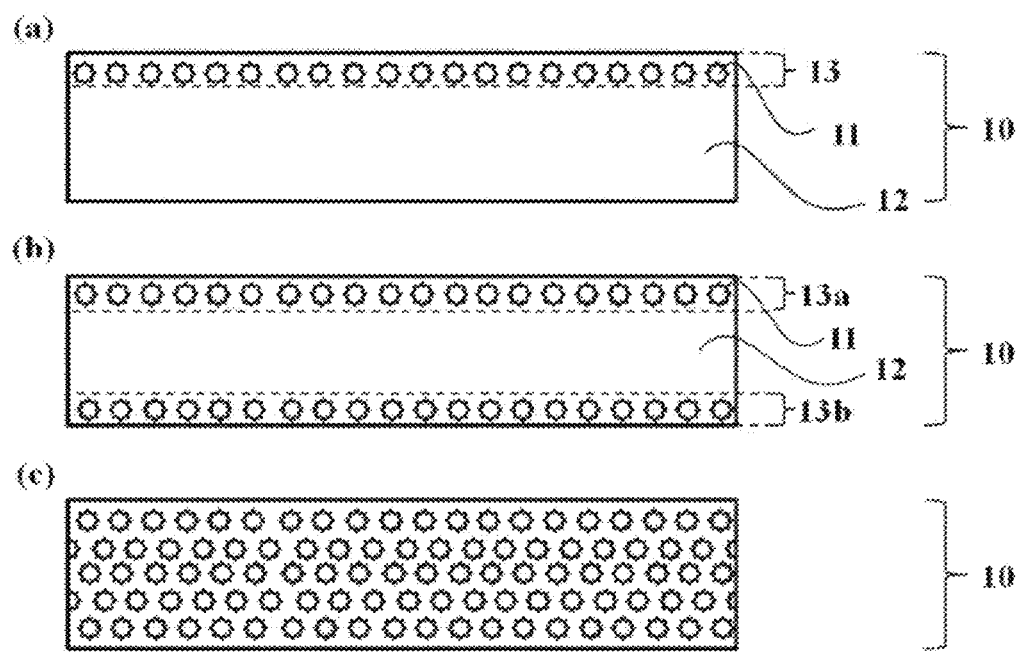

[FIG. 2]
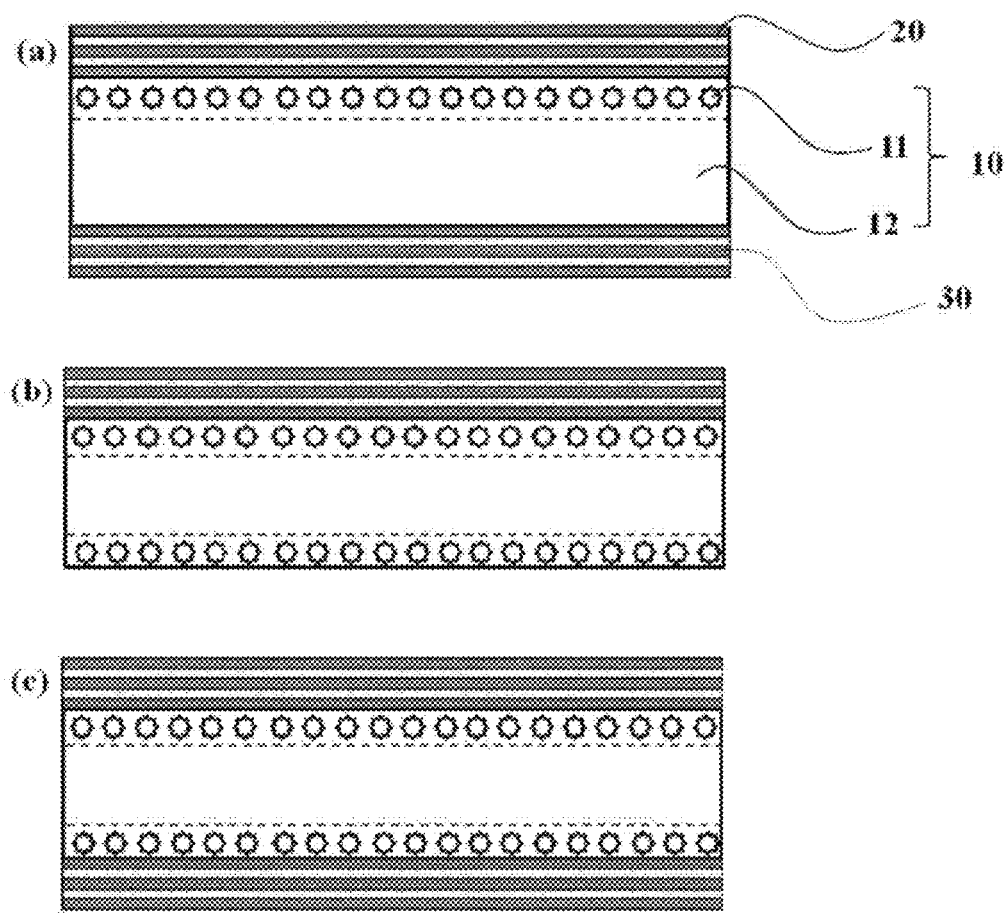

[FIG. 3]
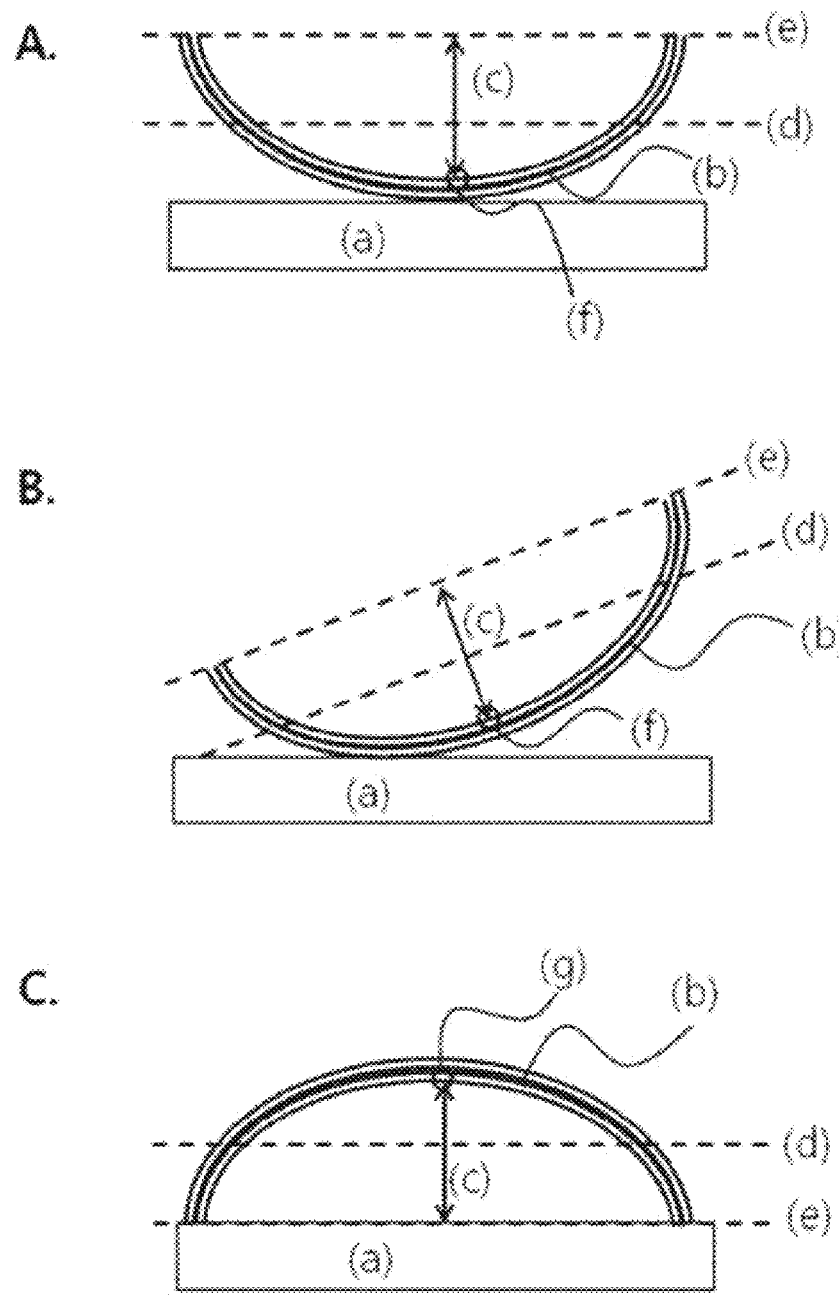

[FIG. 4]
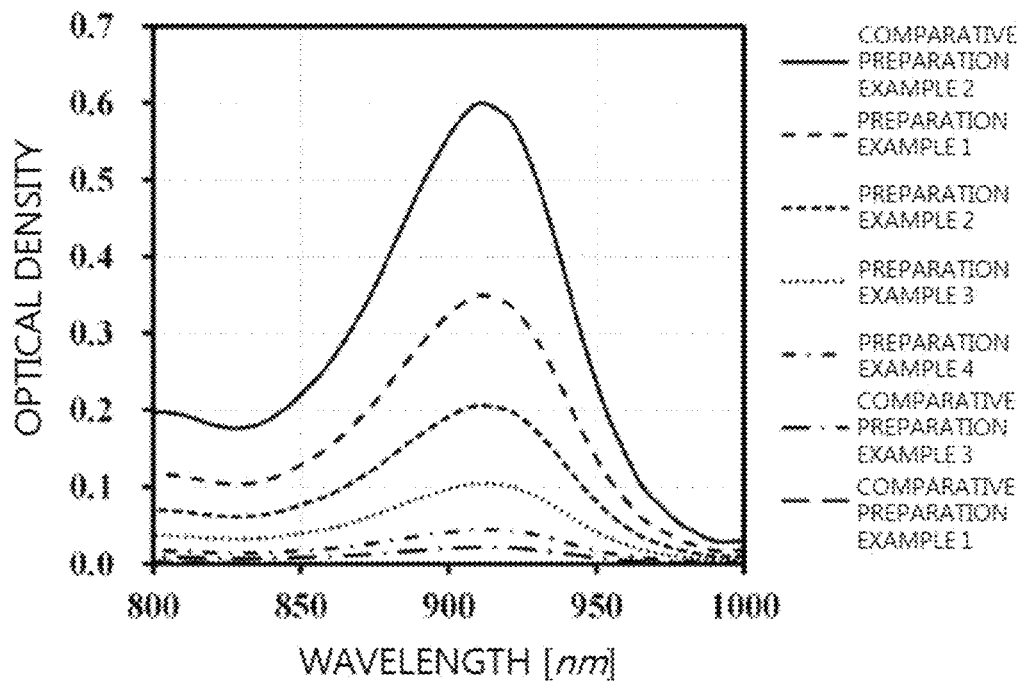
[FIG. 5]
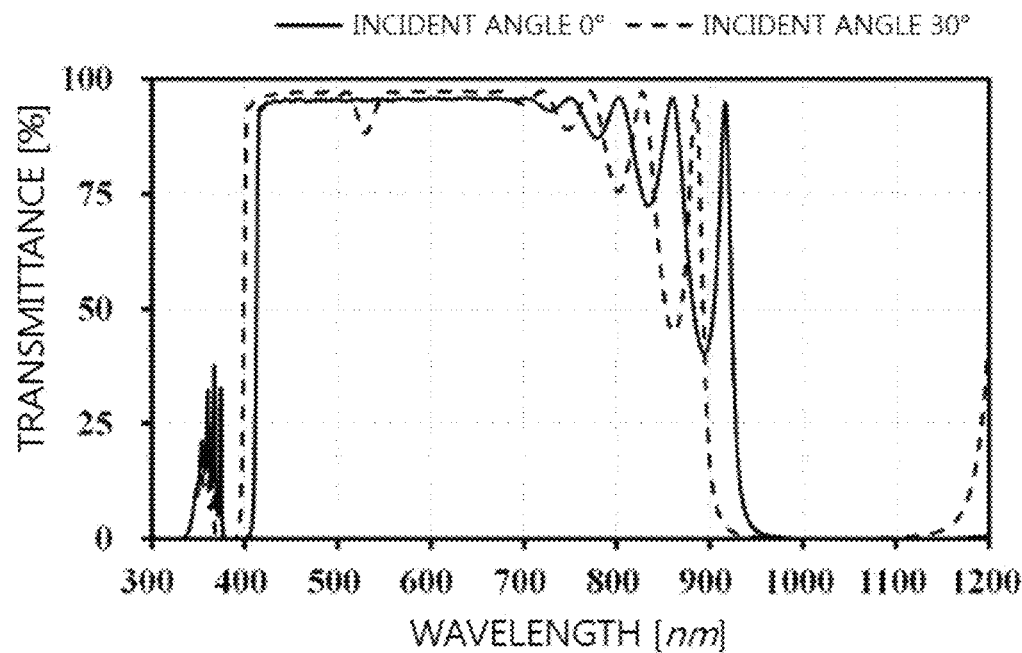

[FIG. 6]
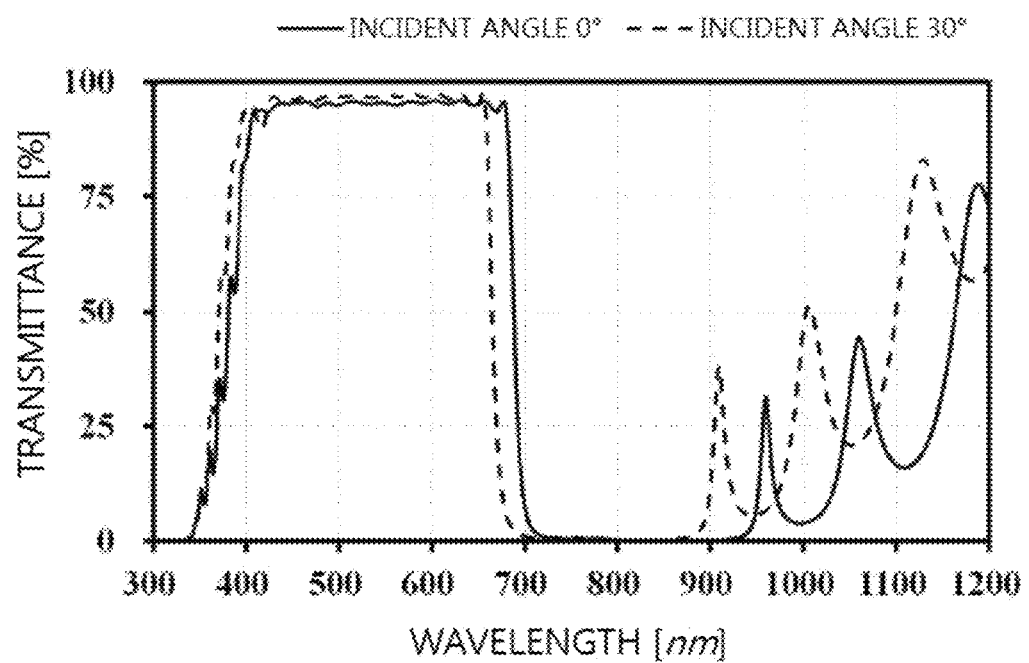

[FIG. 7]
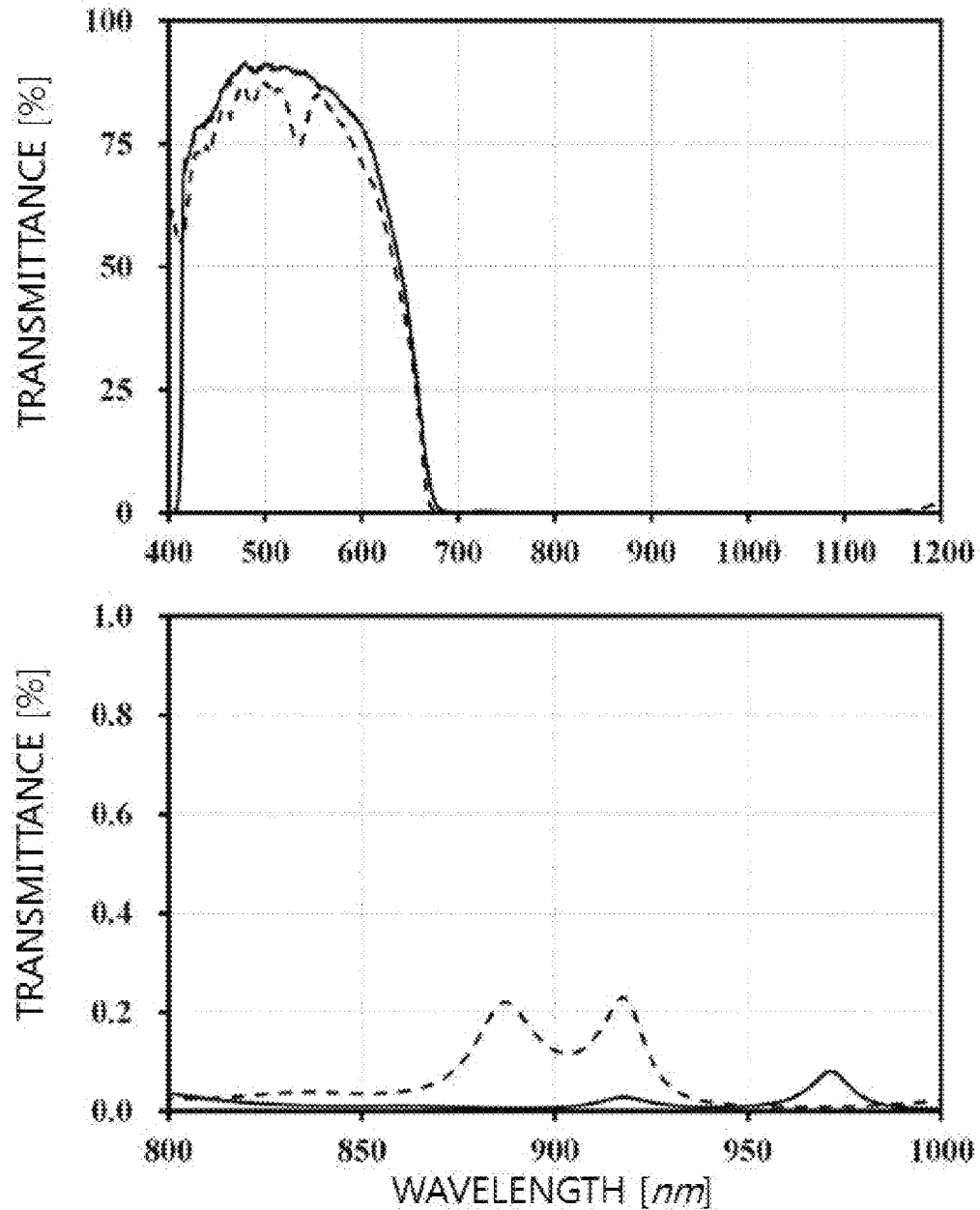

[FIG. 8]
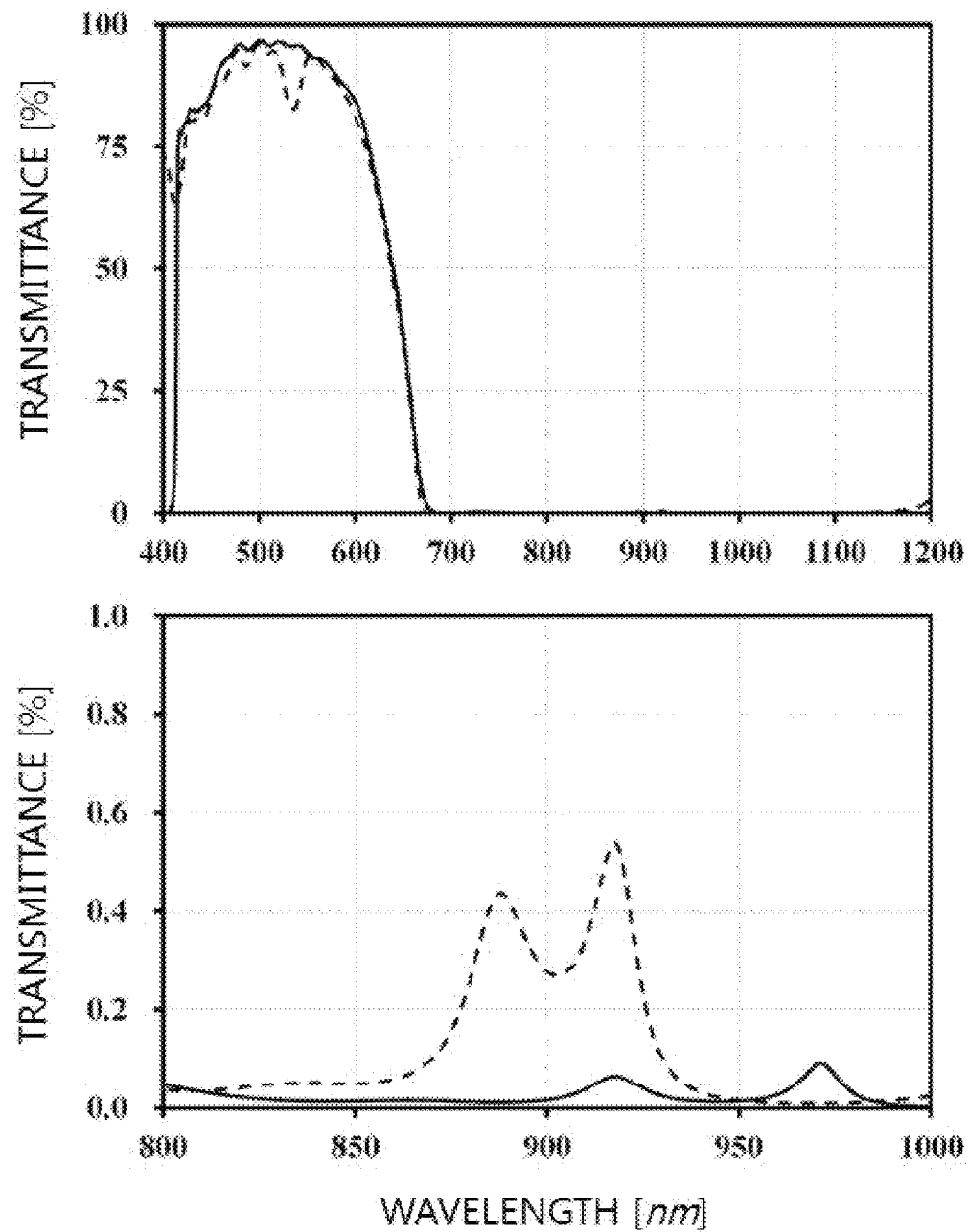

[FIG. 9]
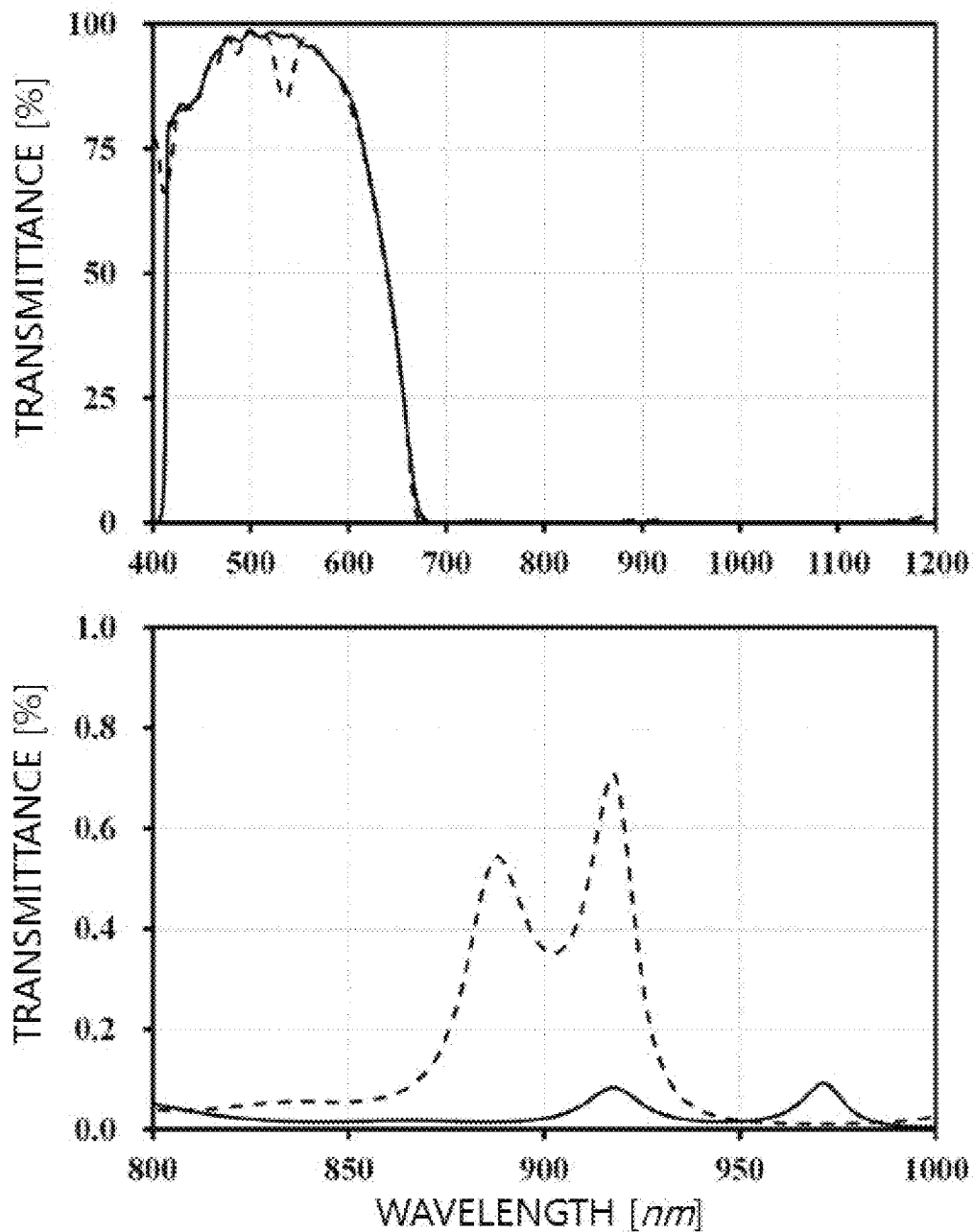

[FIG. 10]
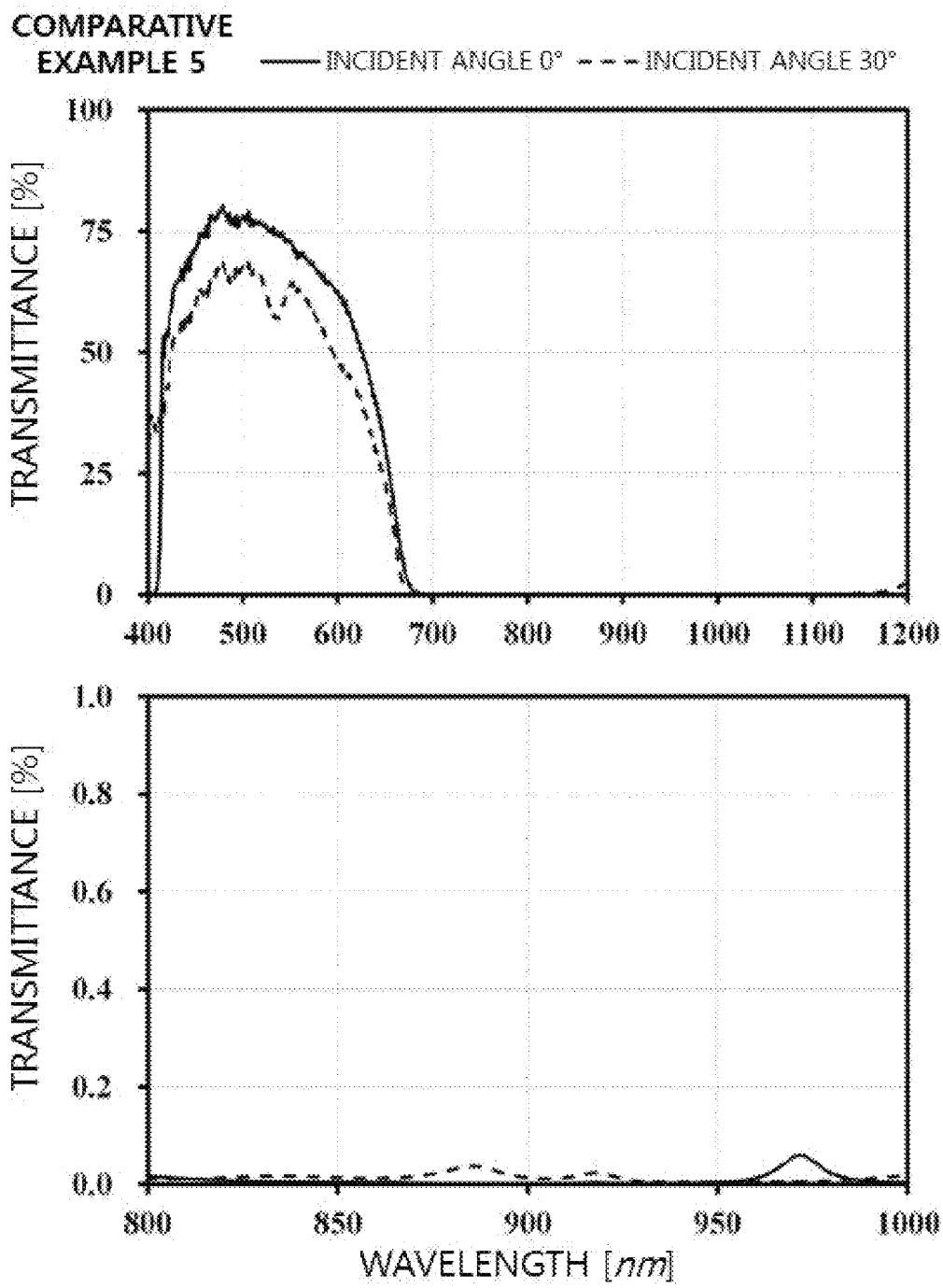

[FIG. 11]
(a) EQUIPPED WITH OPTICAL FILTER ACCORDING TO EXAMPLE 7
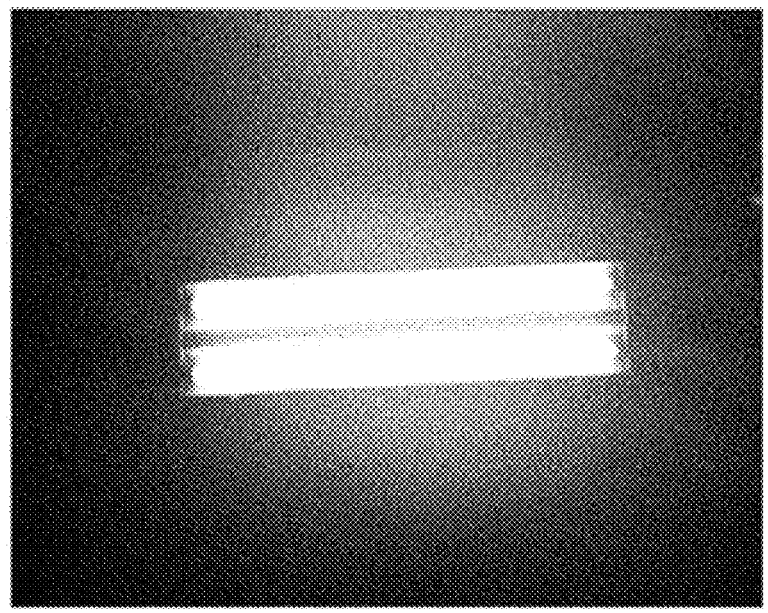
(b) EQUIPPED WITH OPTICAL FILTER ACCORDING TO COMPARATIVE EXAMPLE 6
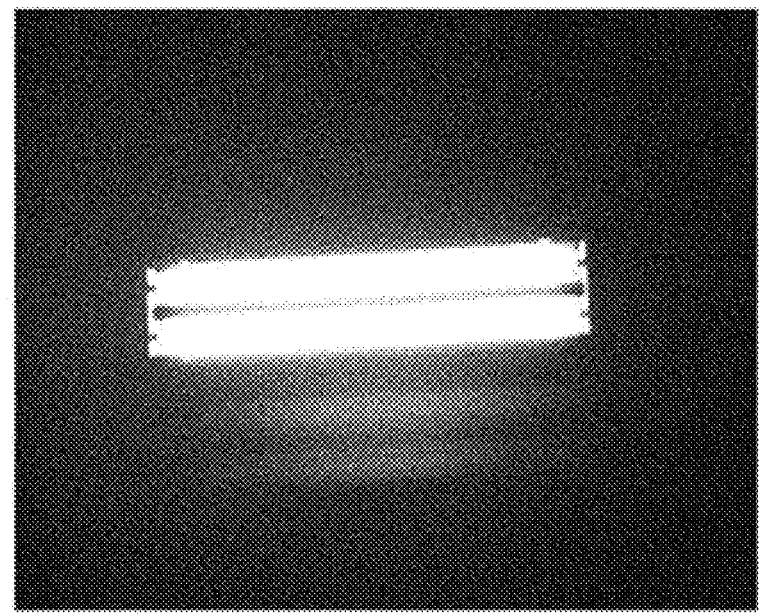

OPTICAL ARTICLE AND OPTICAL FILTER COMPRISING SAME

CROSS REFERENCE TO RELATED APPLICATIONS

This application is a National Phase filing under 35 U.S.C. § 371 of PCT/KR2017/001688 filed on Feb. 16, 2017, and claims priority to Korean Patent Application No. 10-2017-0007027 filed on Jan. 16, 2017, and Korean Patent Application No. 10-2016-0021622 filed on Feb. 24, 2016, under 35 U.S.C. § 119. The entire contents of each application are hereby incorporated by reference.

TECHNICAL FIELD

The present invention relates to an optical article and an optical filter including the same, and more particularly, to an optical article which can suppress light transmittance in the wavelength range from 800 to 1,000 nm and an optical filter including the same.

BACKGROUND ART

To obtain a natural color image as seen by the human eye, an imaging device using a solid-state imaging element such as a CMOS image sensor (CIS) essentially requires an optical article which shields light in the near-infrared range of 800 to 1,000 nm detected by a sensor, transmits light in the range of 400 to 600 nm, and thus can approximate human visibility.

As such an optical article, a reflective near-infrared shielding filter including a dielectric multilayer film or an absorbing near-infrared shielding filter using a fluorophosphate-based glass containing a divalent copper ion as a coloring component may be used.

However, a conventionally used reflective near-infrared shielding filter has a limit in that it cannot be applied to a high-resolution camera module with 5 or more mega pixels since a phenomenon of taking an unintended image (hereinafter, referred to as "ghosting" or "ghost image") when an image is taken by an imaging device due to internal reflection between an optical filter and a lens of a solid-state imaging element, particularly, between an optical filter and a CIS microlens.

In addition, a conventional absorbing near-infrared shielding filter has a preferable effect of shielding light in the wavelength range from 800 to 1,000 nm, but due to low durability because of the properties of a material, it is difficult to be manufactured thin and thus is easily breakable.

Therefore, there is an urgent demand for development of an optical article which can shield light in the wavelength range from 800 to 1,000 nm, and can be manufactured to be thinner.

DISCLOSURE

Technical Problem

The present invention is directed to providing an optical article which has excellent transmittance with respect to light with a wavelength in the visible light range, is able to prevent ghosting by selectively and/or effectively shielding light in the wavelength range of 800 to 1,000 nm and facilitates a thinner imaging device.

The present invention is also directed to providing an optical filter including the optical article.

The present invention is also directed to providing an imaging device including the optical article.

Technical Solution

To achieve the objects of the present invention, an exemplary embodiment of the present invention provides an optical article, which includes a transparent base containing one or more types of near-infrared absorbing dyes, and which has two or more absorption peaks including first and second absorption peaks shown below when an absorption spectrum measured using a spectrophotometer in the wavelength range of 380 to 1,200 nm, wherein the first absorption peak has the absorption maximum ($\lambda$max1) in the wavelength range of 650 to 750 nm, and the second absorption peak has the absorption maximum ($\lambda$max2) in the wavelength range of 830 to 980 nm, and when an optical density value (OD1) at the absorption maximum of the first absorption peak is normalized to be 1, an optical density value (OD2) at the absorption maximum of the second absorption peak satisfies the following Equation 1:

$$0.03 < OD2 < 0.36. \qquad \text{[Equation 1]}$$

In addition, an exemplary embodiment of the present invention provides an optical filter including the optical article.

Advantageous Effects

An optical filter according to the present invention includes an optical article containing one or more types of near-infrared absorbing dyes and having two or more absorption peaks including first and second absorption peaks in the wavelength range from 380 to 1,200 nm, thereby exhibiting high transmittance with respect to light with a wavelength in a visible light range and suppressing transmittance with respect to light with a wavelength range of 800 to 1,000 nm to 0.6% or less. Therefore, the optical filter has advantages in that a ghosting problem can be prevented, a thin image device can be easily manufactured, and production costs can be reduced due to improved yield and productivity in an assembly process.

DESCRIPTION OF DRAWINGS

FIG. 1 is a cross-sectional view illustrating a structure of an optical article according to an exemplary embodiment of the present invention.

FIG. 2 is a cross-sectional view illustrating a structure of an optical filter according to another exemplary embodiment of the present invention.

FIG. 3 is a cross-sectional view illustrating warpage of an optical filter:

A to C and (a) to (g) are as follows.

A and B: specimens bent in a (−) direction, C: specimen bent in a (+) direction, (a): horizontal surface, (b): specimen, (c): degree of warpage, (d): intermediate surface, (e): surface having ends of the specimen, (f) and (g): points with the highest degree of warpage on the inner surface of the specimen.

FIG. 4 is a graph illustrating an optical density curve for each of optical articles according to the content of a near-infrared absorbent according to an exemplary embodiment of the present invention FIGS. 5 and 6 are graphs illustrating spectral transmittances of first and second selective wavelength reflection layers according to an exemplary embodiment of the present invention, respectively.

FIGS. 7 to 10 are graphs illustrating spectral transmittances in the wavelength range of 300 to 1,200 nm measured for optical filters manufactured in Examples 5 and 7 according to an exemplary embodiment of the present invention and Comparative Examples 4 and 5.

FIG. 11 is a set of images taken using imaging devices equipped with optical filters according to Example 7 according to an exemplary embodiment of the present invention and Comparative Example 6, respectively.

MODES OF THE INVENTION

While the present invention can be modified and implemented in various forms, only specific embodiments will be described in detail.

However, the present invention is not limited to the specific embodiments, and it should be understood that the present invention includes all modifications, equivalents and alternatives included in the technical idea and scope of the present invention.

In the present invention, it should be understood that the term "include," "have" or "comprise" indicates that a feature, a number, a step, an operation, a component, a part or a combination thereof described in the specification is present, but does not exclude the possibility of presence or addition of one or more other features, numbers, steps, operations, components, parts or combinations thereof in advance.

In addition, it should be understood that the accompanying drawings in the present invention are exaggerated or downsized for the convenience of description.

Hereinafter, the present invention will be described in detail with reference to the drawings, and regardless of the reference marks on the drawings, like reference numerals will be assigned to the like or corresponding components, and duplicated descriptions thereof will be omitted.

The "visible light" used herein refers to light in a wavelength range capable of being detected by the human eye among electromagnetic waves, and preferably, light in the wavelength range of 380 to 750 nm.

In addition, the "near-infrared ray" used herein refers to an electromagnetic wave which is located outside the end of the red ray and longer than the visible light, and light in the wavelength range of 750 to 3 μm. In the present invention, a degree of shielding the "near-infrared ray" may be expressed as an optical density with respect to the near-infrared ray. Here, the optical density (OD) is determined as the value obtained by taking a common log for Io/I where the intensity of light incident when light passes through a light absorbing medium is Io, and the intensity of light passing is I. That is, it refers to the value expressed by the equation: optical density (OD)=log(Io/I). The optical density may be calculated using a spectrophotometer.

In addition, the "absorption maximum" used herein refers to a wavelength in a wavelength range in which light is absorbed, that is, the wavelength having the highest optical density in the wavelength range.

Moreover, the "degree of warpage" used herein is a measure of the degree to which an optical filter is bent, and as shown in FIGS. 3A and 3B, it means, based on a plane (e) formed by linearly connecting the ends of a specimen (b), the height of the highest point (f) of heights of arbitrary points present on the inner surface of the specimen (b). Here, the "inner surface of the specimen" refers to the surface with the shortest length of the both surfaces of the specimen which is bent, and the opposite surface is called the "outer surface of the specimen." The higher the degree (c) of warpage of the specimen (b), the greater the height is.

In addition, the "warpage direction" used herein may refer to a direction of bending an optical filter, which may be a (+) or (−) direction. Specifically, as shown in FIGS. 3A and 3B, when the point (f) having the highest degree of warpage (c) is present between the horizontal surface (a) and the intermediate plane (d) on the inner surface of the specimen (b) based on the plane (e) formed by connecting the ends of the specimen (b) with a straight line, the warpage of the specimen (b) may have a (−) direction. Unlike this, as shown in FIG. 3C, based on the plane (e) formed by connecting the ends of the specimen (b) with a straight line, when there is no point (g) having the highest degree of warpage (c) between the horizontal surface (a) and the intermediate plane (d) on the inner surface of the specimen (b), the warpage of the specimen (b) may have a (+) direction.

Here, the "intermediate plane (d)" is a plane present between the point (f or g) having the highest degree of warpage (c) on the inner surface of the specimen (b) and the plane (e) formed by connecting the ends of the specimen (b) with a straight line, and is a plane parallel to the plane (e) at the position in which the height of the point (f or g) is ½.

In addition, the "horizontal surface (a)" is the plane supporting a specimen while the degree of warpage of the specimen (b) is measured, and may include a specimen-mounting surface of a three-dimensional surface measuring device such as the Ultrahigh Accurate 3-D Profilometer.

Further, the "alkyl group" used herein refers to a substituent derived from a linear or branched saturated hydrocarbon.

Here, the "alkyl group" may be, for example, a methyl group, an ethyl group, an n-propyl group, an iso-propyl group, an n-butyl group, a sec-butyl group, a tert-butyl group, an n-pentyl group, a 1,1-dimethylpropyl group, a 1,2-dimethylpropyl group, a 2,2-dimethylpropyl group, a 1-ethylpropyl group, a 2-ethylpropyl group, an n-hexyl group, a 1-methyl-2-ethylpropyl group, a 1-ethyl-2-methylpropyl group, a 1,1,2-trimethylpropyl group, a 1-propylpropyl group, a 1-methylbutyl group, a 2-methylbutyl group, a 1,1-dimethylbutyl group, a 1,2-dimethylbutyl group, a 2,2-dimethylbutyl group, a 1,3-dimethylbutyl group, a 2,3-dimethylbutyl group, a 2-ethylbutyl group, a 2-methylpentyl group, or a 3-methylpentyl group.

In addition, the "alkyl group" may have 1 to 20 carbon atoms, for example, 1 to 12, 1 to 6 or 1 to 4 carbon atoms.

Moreover, the "cycloalkyl group" used herein refers to a substituent derived from a monocyclic saturated hydrocarbon.

The "cycloalkyl group" may be, for example, a cyclopropyl group, a cyclobutyl group, a cyclopentyl group, a cyclohexyl group, a cycloheptyl group, or a cyclooctyl group.

In addition, the "cycloalkyl group" may have 3 to 20 carbon atoms, for example, 3 to 12 or 3 to 6 carbon atoms.

Further, the "aryl group" used herein refers to a univalent substituent derived from an aromatic hydrocarbon.

Here, the "aryl group" may be, for example, a phenyl group, a naphthyl group, an anthracenyl group, a phenanthryl group, a naphthacenyl group, a pyrenyl group, a tolyl group, a biphenyl group, a terphenyl group, a chrycenyl group, a spirobifluorenyl group, a fluoranthenyl group, a fluorenyl group, a perylenyl group, an indenyl group, an azulenyl group, a heptalenyl group, a phenalenyl group, or a phenanthrenyl group.

In addition, the "aryl group" may have 6 to 30 carbon atoms, for example, 6 to 10, 6 to 14, 6 to 18, or 6 to 12 carbon atoms.

Moreover, the "heteroaryl group" used herein refers to an "aromatic heterocylic group" or "heterocyclic group" derived from a single ring or a condensed ring. The "heteroaryl group" may include at least one, for example, 1, 2, 3 or 4 selected from nitrogen (N), sulfur (S), oxygen (O), phosphorus (P), selenium (Se) and silicon (Si) as a heteroatom.

Here, the "heteroaryl group" may be, for example, a nitrogen-containing heteroaryl group such as a pyrrolyl group, a pyridyl group, a pyridinyl group, a pyridazinyl group, a pyrimidinyl group, a pyrazinyl group, a triazolyl group, a tetrazolyl group, a benzotriazolyl group, a pyrazolyl group, an imidazolyl group, a benzimidazolyl group, an indolyl group, an indolinyl group, an isoindolyl group, an indolizinyl group, a purinyl group, an indazolyl group, a quinolyl group, an isoquinolinyl group, a quinolizinyl group, a phthalazinyl group, a naphthylidinyl group, a quinoxalinyl group, a quinazolinyl group, a cinnolinyl group, a pteridinyl group, an imidazotriazinyl group, an acridinyl group, a phenanthridinyl group, a carbazolyl group, a carbazolinyl group, a pyrimidinyl group, a phenanthrolinyl group, a phenazinyl group, an imidazopyridinyl group, an imidazopyrimidinyl group, or a pyrazolopyridinyl group; a sulfur-containing heteroaryl group such as a thienyl group, a benzothienyl group or a dibenzothienyl group; or an oxygen-containing heteroaryl group such as a furyl group, a pyranyl group, a cyclopentapyranyl group, a benzofuranyl group, an isobenzofuranyl group, a dibenzofuranyl group, a benzodioxole group or a benzotrioxole group.

In addition, specific examples of the "heteroaryl group" may include compounds including at least two heteroatoms selected from, for example, a thiazolyl group, an isothiazolyl group, a benzothiazolyl group, a benzothiadiazolyl group, a phenothiazinyl group, an isoxazolyl group, a furazanyl group, a phenoxazinyl group, an oxazolyl group, a benzoxazolyl group, an oxadiazolyl group, a pyrazoloxazolyl group, an imidazothiazolyl group, a thienofuranyl group, a furopyrrolyl group, and a pyridoxazinyl group.

Further, the "heteroaryl group" may have 2 to 20 carbon atoms, for example, 4 to 19, 4 to 15 or 5 to 11 carbon atoms. For example, when a heteroatom is included, the heteroaryl group may have 5 to 21 ring members.

In addition, the "aralkyl group" used herein refers to a saturated hydrocarbon substituent in which a univalent substituent derived from an aromatic hydrocarbon is bonded to a hydrogen site of a terminal hydrocarbon. That is, the "aralkyl group" is an alkyl group in which an end of the chain is substituted with an aryl group, for example, a benzyl group, a phenethyl group, a phenylpropyl group, a naphthalenylmethyl group, or a naphthalenylethyl group.

Hereinafter, the present invention will be described in detail.

<Optical Article>

In an exemplary embodiment of the present invention, an optical article which includes a transparent base containing one or more near-infrared absorbing dyes, has two or more absorption peaks including first and second absorption peaks in an absorption spectrum measured using a spectrophotometer in a wavelength range of 380 to 1,200 nm, wherein the first absorption peak has the absorption maximum ($\lambda$max1) at a wavelength range of 650 to 750 nm, and the second absorption peak has the absorption maximum ($\lambda$max2) at a wavelength range of 830 to 980 nm, and when an optical density value (OD1) at the absorption maximum of the first absorption peak is normalized to be 1, an optical density value (OD2) at the absorption maximum of the second absorption peak satisfies the following Equation 1:

$$0.03 < OD2 < 0.36. \qquad \text{[Equation 1]}$$

To obtain a natural color image as seen by the human eye, an imaging device using a solid-state imaging element essentially requires an optical article which shields light in a near-infrared range of 800 to 1,000 nm detected by a sensor, transmits light in a range of 400 to 600 nm, and thus can approximate human visibility. As such an optical article, an optical filter such as a reflective near-infrared shielding filter or an absorbing near-infrared shielding filter may be used, and the reflective near-infrared shielding filter cannot be applied to a high-resolution camera module with 5 or more mega pixels due to severe ghosting caused by internal reflection between the optical filter and a CIS microlens. In addition, in the case of the absorbing near-infrared shielding filter using a fluorophosphate-based glass containing a divalent copper ion as a coloring component, there is difficulty in being manufactured thinner due to low durability because of the properties of a material; and there is difficulty in selectively suppressing the transmittance of light with a wavelength in the range of 800 to 1,000 nm.

To overcome such problems, the optical article according to the present invention may include one or more near-infrared absorbing dyes. The optical article includes one or more near-infrared absorbing dyes to exhibit high transmittance with respect to light with a wavelength in the visible light range, and suppress the transmittance with respect to light with a wavelength in the range of 800 to 1,000 nm, and therefore, the thickness of the selective wavelength reflection layer included in the optical filter may be reduced, and thus a thin optical filter may be easily manufactured.

Here, the optical article may have one or more absorption peaks each in the wavelength range of 650 to 750 nm and the wavelength range of 830 to 980 nm, and the absorption peak may include first and second absorption peaks having the absorption maximums $\lambda$max1 and $\lambda$max2. In addition, when the optical density value (OD1) at the absorption maximum of the first absorption peak is normalized to be 1, an optical density value (OD2) at the absorption maximum of the second absorption peak may be more than 0.03 and less than 0.36, and specifically, 0.035 to 0.05; 0.08 to 0.12; 0.18 to 0.24; 0.34 to 0.35; 0.04 to 0.35; 0.05 to 0.3; 0.1 to 0.3; 0.15 to 0.25; or 0.2 to 0.30, which satisfies Equation 1. Preferably, the optical density value (OD2) at the absorption maximum of the second absorption peak may be 0.18 to 0.35, which satisfies the condition for Equation 1. The optical article according to the present invention may include a transparent base, and the transparent base may have a structure including one or more near-infrared absorbing dyes absorbing light in the wavelength range of 600 to 1,000 nm.

FIG. 1 is a cross-sectional view illustrating a structure of the optical article according to the present invention. Referring to FIGS. 1A to C, the optical article may include a transparent base 10, which may include near-infrared absorbing dyes 11 and a base layer 12. Here, the near-infrared absorbing dyes 11, as shown in FIGS. 1A and 1B, may be included in near-infrared absorbing layers 13, 13a and/or 13b formed on one surface and/or both surfaces of the base layer 12, or as shown in FIG. 1C, may be uniformly dispersed in the base layer 12.

Hereinafter, each component of the transparent base 10 included in the optical article according to the present invention will be described in further detail.

First, in the transparent base according to the present invention, the base layer 12 serves as a base substrate for the transparent base and the optical filter including the same, and is formed of any transparent material without particular limitation.

The base layer 12 may be formed of various materials known in the art, which may be suitably selected according to the required function and use. As the base layer 12, for example, one or more selected from glass and a polymer resin may be used. In addition, the polymer resin may be, for example, a polyester-based resin, a polycarbonate-based resin, an acryl-based resin, a polyolefin-based resin, a cyclic olefin-based resin, a polyimide-based resin, a polyamide-based resin, or a polyurethane-based resin, and the resin may be used in the form of a single sheet, a stacked sheet or a co-extrusion product.

In addition, the base layer 12 consists of a polymer resin according to an exemplary form, and may include a polyester-based resin advantageous for heat resistance as a base resin. As an example of the polyester-based resin, one or more selected from the group consisting of polyethylene terephthalate (PET), polyethylene naphthalate (PEN) and polybutylene terephthalate (PBT) may be used, but the present invention is not limited thereto. In addition, as another example, the base layer 12 may be formed of a polyolefin-based resin, which may be, for example, polypropylene (PP).

In addition, in the transparent base according to the present invention, the near-infrared absorbing dyes 11 may be any dye, pigment and/or metal complex, which absorb(s) light in the wavelength range of 600 to 1,000 nm without particular limitation.

As an example, the near-infrared absorbing dyes 11 may include dyes having the absorption maximums in the wavelength range of 650 to 750 nm and the wavelength range of 830 to 980 nm, specifically, first and second dyes having the absorption maximums ($\lambda$max1 and $\lambda$max2) in the wavelength range of 650 to 750 nm and the wavelength range of 830 to 980 nm, in the measurement of an absorption spectrum using a spectrophotometer in the wavelength range of 380 to 1,200 nm.

Here, when the near-infrared absorbing dyes 11, as described above, are included in the absorbing layer 13 formed on one surface of the base layer 12 or dispersed in the base layer 12, the first and second dyes may be uniformly mixed (see FIGS. 1A and 1C). In addition, when the near-infrared absorbing dyes 11 are included in the near-infrared absorbing layers 13a and 13b formed on the both surfaces of the base layer 12, the first and second dyes may be each independently used, or uniformly mixed for the absorbing layers 13a and 13b (see FIG. 1B).

In addition, examples of the near-infrared absorbing dyes 11 may include a cyanine-based compound, a phthalocyanine-based compound, a naphthalocyanine-based compound, a porphyrin-based compound, a benzoporphyrin-based compound, a squarylium-based compound, an anthraquinone-based compound, a croconium-based compound, a diimonium-based compound, and a dithiol metal complex. As an example, the near-infrared absorbing dyes 11, as first and second dyes, may include one or more selected from compounds represented by the following Formulas 1 and 2:

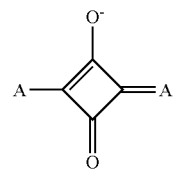
[Formula 1]

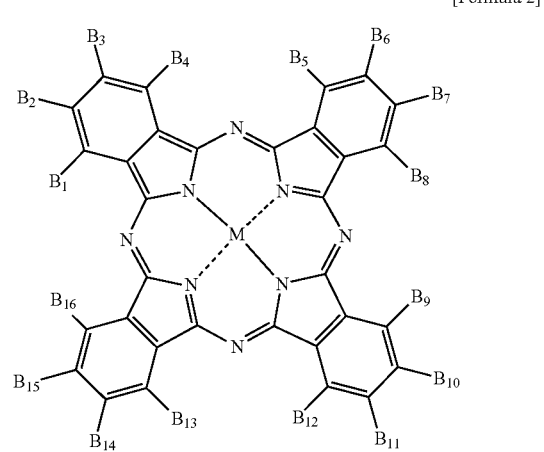
[Formula 2]

In Formulas 1 and 2, A is an aminophenyl group; an indolylmethylene group; or an indolinyl group, and two As are conjugated with each other with

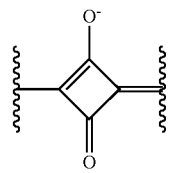 [SMILES: *C1=C([O-])C(=*)C1=O]

as a center. Any one or more of hydrogens present in the aminophenyl, indolylmethylene or indolinyl group may be unsubstituted or substituted with hydrogen, a halogen element, a hydroxyl group, a cyano group, a nitro group, a carboxyl group, an alkyl group having 1 to 20 carbon atoms, a cycloalkyl group having 3 to 20 carbon atoms, an alkoxy group having 1 to 10 carbon atoms, an aralkyl group having 7 to 20 carbon atoms, a sulfonamide group, or an amide group unsubstituted or substituted with an alkyl group having 1 to 4 carbon atoms, a haloalkyl group having 1 to 4 carbon atoms or an aralkyl group having 7 to 20 carbon atoms;

$B_1$, $B_2$, $B_3$, $B_4$, $B_5$, $B_6$, $B_7$, $B_8$, $B_9$, $B_{10}$, $B_{11}$, $B_{12}$, $B_{13}$, $B_{14}$, $B_{15}$ and $B_{16}$ are each independently hydrogen, a halogen element, a hydroxyl group, a cyano group, a nitro group, a carboxyl group, a phenoxy group, a phenylsulfanyl group, an alkyl group having 1 to 20 carbon atoms, a cycloalkyl group having 3 to 20 carbon atoms, an alkoxy group having 1 to 10 carbon atoms, an alkylamine group having 1 to 10 carbon atoms or an aralkyl group having 7 to 20 carbon atoms, and any one or more of the hydrogens present in the phenoxy group, the phenylsulfanyl group, the alkyl group having 1 to 20 carbon atoms, the cycloalkyl group having 3 to 20 carbon atoms, the alkoxy group having 1 to 10 carbon atoms, the alkylamine group having 1 to 10 carbon atoms or the aralkyl group having 7 to 20 carbon atoms may be unsubstituted or substituted with a halogen element, a hydroxyl group, a cyano group, an aminophenyl group, a phenoxy group, a phenylsulfanyl group, an indole group, an indolinyl group, a pyridinyl group, an alkyl group having 1 to 10 carbon atoms, a haloalkyl group having 1 to 6 carbon atoms or an aralkyl group having 7 to 20 carbon atoms; and M is copper, zinc, nickel, titanium, vanadium, indium, gallium, platinum, silicon, oxotitanium or oxovanadium.

Specifically, Formula 1 may be any one of the compounds represented by Formulas 1A to 1C as below:

[Formula 1A]

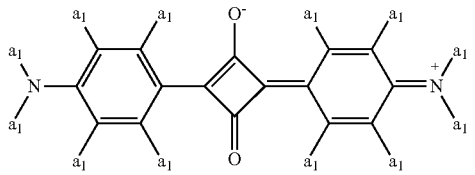

[Formula 1B]

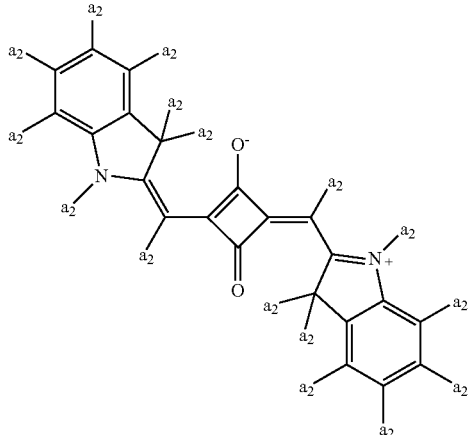

[Formula 1C]

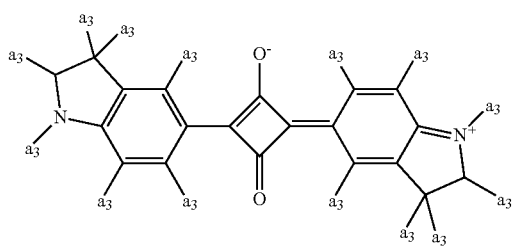

In Formulas 1A to 1C, $a_1$, $a_2$ and $a_3$ are each independently hydrogen, a halogen element, a hydroxyl group, a cyano group, a nitro group, a carboxyl group, an alkyl group having 1 to 10 carbon atoms, a cycloalkyl group having 3 to 10 carbon atoms, an alkoxy group having 1 to 6 carbon atoms, an aralkyl group having 7 to 20 carbon atoms, a sulfonamide group, or an amide group unsubstituted or substituted with an alkyl group having 1 to 4 carbon atoms, a haloalkyl group having 1 to 4 carbon atoms or an aralkyl group having 7 to 20 carbon atoms.

Further, a content of the near-infrared absorbing dyes 11 may be 0.01 to 10.0 parts by weight; 0.01 to 8.0 parts by weight; or 0.01 to 5.0 parts by weight with respect to 100 parts by weight of a resin constituting a matrix of the near-infrared absorbing layer 13, 13a or 13b.

<Optical Filter>

In addition, in an exemplary embodiment of the present invention, an optical filter including the optical article is provided.

As an example, the optical filter according to the present invention may include a transparent base containing one or more near-infrared absorbing dyes; and a selective wavelength reflection layer formed one or both surfaces of the transparent base, and may satisfy the following conditions (A) and (B) in the measurement of a transmission spectrum using a spectrophotometer in the wavelength range of 380 to 1,200 nm:

(A) in the wavelength range of 800 to 1,000 nm, the maximum transmittance with respect to light incident in the vertical direction of the optical filter is 0.3% or less; and (B) in the wavelength range of 800 to 1,000 nm, the maximum transmittance with respect to light incident in a direction having an angle of 30° with respect to the direction perpendicular to the optical filter is 0.6% or less.

The optical filter according to the present invention may include an optical article containing first and second dyes having the absorption maximums in the wavelength range of 650 to 750 nm and the wavelength range of 830 to 980 nm, respectively, such that light incident on the optical filter may have approximately 90% or more light transmittance in the visible light range, that is, the wavelength range of approximately 430 to 565 nm regardless of an incident angle (an angle with the vertical direction of the optical filter), that is, a viewing angle. In addition, the optical filter may suppress transmittance such that light with a wavelength of approximately 800 to 1,000 nm is transmitted with a maximum transmittance of 1% or less, 0.9% or less, 0.8% or less, 0.7% or less or 0.6% or less regardless of an incident angle. Particularly, the optical filter, when light is incident at an angle of 30°, may exhibit a maximum transmittance of 0.6% or less, 0.55% or less, or 0.5% or less, and an average transmittance of 0.3% or less, 0.2% or less or 0.1% or less. As an example, when a transmission spectrum is measured for the optical filter with respect to light having each of incident angles of 0° and 30° using a spectrophotometer in a wavelength range of 300 to 1,200 nm, maximum transmittances in the wavelength range of 800 to 1,000 nm may be suppressed to 0.1% or less and 0.5% or less, respectively, such that the conditions (A) and (B) may be satisfied.

This means that since the optical filter according to the present invention includes the optical article, it exhibits high transmittance with respect to light with a wavelength in the visible light range, and also can suppress a transmittance with respect to light with a wavelength in the range of 800 to 1,000 nm to 0.6% or less.

FIG. 2 is a cross-sectional view of a structure of an optical filter according to an exemplary embodiment of the present invention. Referring to FIG. 2, the optical filter according to the present invention may have a structure including a transparent base 10 including near-infrared absorbing dyes 11 and a base layer 12, and selective wavelength reflection layer(s) 20 and/or 30 located on one surface and/or both surfaces of the transparent base.

Hereinafter, each component of the optical filter according to the present invention will be described in further detail with reference to FIG. 2.

First, in an optical filter according to the present invention, a transparent base 10 serves as a base substrate for the optical filter by including a base layer 12. The transparent base 10, that is, an optical article, includes one or more near-infrared absorbing dyes and thus can have two or more absorption peaks having the absorption maximums in the wavelength range of 650 to 750 nm and the wavelength range of 830 to 980 nm, respectively, and the absorption peaks may include first and second absorption peaks. In addition, when an optical density value (OD1) at the absorption maximum of the first absorption peak is normalized to be 1, an optical density value (OD2) at the absorption maximum of the second absorption peak may range from more than 0.03 and less than 0.36, and specifically, 0.035 to 0.05; 0.08 to 0.12; 0.18 to 0.24; 0.34 to 0.35; 0.04 to 0.35; 0.05 to 0.3; 0.1 to 0.3; 0.15 to 0.25; or 0.2 to 0.3, which satisfies Equation 1. Preferably, the optical density value (OD2) at the absorption maximum of the second absorption peak may range from 0.18 to 0.35, which satisfies the condition for Equation 1. Under the above condition, among incident light, light with a wavelength of 700 nm or more, specifically, a wavelength in the range of 800 to 1,000 nm, may be selectively and/or effectively absorbed, and high transmittance with respect to light in the visible light range may be provided.

In addition, in the optical filter according to the present invention, the selective wavelength reflection layers 20 and 30 serve to reflect light with a wavelength of 700 nm or more, specifically, a wavelength in the range of 700 to 1,100 nm among light incident on the optical filter to prevent the light in the above-mentioned range from being incident on an image sensor or to prevent the reflection of light in the visible light range with a wavelength ranging from 400 to 700 nm. That is, the selective wavelength reflection layers 20 and 30 may serve as near-infrared reflective layers (near-IR layers) reflecting near-infrared rays and/or anti-reflection layers (AR layers) preventing the reflection of visible light.

Here, the selective wavelength reflection layers 20 and 30 may have a structure such as a dielectric multilayer film formed by alternately stacking a high refractive index layer and a low refractive index layer, and may further include an aluminum-deposited film; a noble metal thin film; or a resin film in which one or more types of particles of indium oxide and tin oxide are dispersed. For example, the selective wavelength reflection layers 20 and 30 may have a structure in which a dielectric layer (not shown) that has a first refractive index and a dielectric layer (not shown) that has a second refractive index are alternately stacked, and the refractive index variation between the dielectric layer having the first refractive index and the dielectric layer having the second refractive index may be 0.2 or more; 0.3 or more; or 0.2 to 1.0.

In addition, as the high refractive index layer and the low refractive index layer for the selective wavelength reflection layers 20 and 30, any layers which have the refractive index variation between the high refractive index layer and the low refractive index layer in the above-described range may be used without specific limitation, and specifically, the high refractive index layer may include one or more selected from the group consisting of titanium oxide, aluminum oxide, zirconium oxide, tantalum pentoxide, niobium pentoxide, lanthanum oxide, yttrium oxide, zinc oxide, zinc sulfide and indium oxide, each having a refractive index of 1.6 to 2.4, and the indium oxide may further include a small amount of titanium oxide, tin oxide or cerium oxide. In addition, the low refractive index layer may include one or more selected from the group consisting of silicon dioxide, lanthanum fluoride, magnesium fluoride and sodium aluminum fluoride (cryolite, $Na_3AlF_6$), each having a refractive index of 1.3 to 1.6.

Further, the selective wavelength reflection layers 20 and 30 may be formed on one surface of the transparent base 10; in some cases, since the first and second selective wavelength reflection layers 20 and 30 are formed on both surfaces of the transparent base 10, a structure in which a first selective wavelength reflection layer is located on a first main surface of the transparent base 10, and a second selective wavelength reflection layer is located on a second main surface of the transparent base 10 may be formed.

In addition, in one exemplary embodiment, when the selective wavelength reflection layer includes the first and second selective wavelength reflection layers 20 and 30, the thickness of each of the selective wavelength reflection layers 20 and 30 may satisfy the following Equation 3:

$$0.8 < D1/D2 < 1.2 \quad \text{[Equation 3]}$$

In Equation 3, D1 represents the thickness of the first selective wavelength reflection layer, and D2 represents the thickness of the second selective wavelength reflection layer.

Specifically, a thickness ratio of the first and second selective wavelength reflection layers 20 and 30 may be 0.8 to 1.2; 0.8 to 1.0; 0.9 to 1.1; 1.0 to 1.2; 0.85 to 1.0; or 1.1 to 1.2, which satisfies the condition for Equation 3.

In another example, when the selective wavelength reflection layers include the first and second selective wavelength reflection layers 20 and 30, each of the selective wavelength reflection layers 20 and 30 may have a dielectric multilayer film structure having 30 layers or less, and may satisfy a condition for Equation 4:

$$0 \le |P1 - P2| < 6 \quad \text{[Equation 4]}$$

In Equation 4, P1 represents the number of stacked layers of the dielectric multilayer film constituting the first selective wavelength reflection layer, and P2 represents the number of stacked layers of the dielectric multilayer film constituting the second selective wavelength reflection layer.

Specifically, the first and second selective wavelength reflection layers 20 and 30 may have a dielectric multilayer film structure having 30 layers or less; 29 layers or less; 28 layers or less; 27 layers or less; 26 layers or less; or 25 layers or less, and at this time, the deviation in the layer number may be less than 6 layers, 1 to 5 layers, 2 to 5 layers; 3 to 5 layers; 1 to 3 layers; 0 to 3 layers; or 2 to 4 layers, and may satisfy the condition for Equation 4.

The present invention may reduce warpage occurring in manufacture of the optical filter by controlling the deviation in the number of stacked layers and thickness ratio between the first and second selective wavelength reflection layers 20 and 30 to be in the above ranges, and therefore an imaging device including the same has an advantage in which it is possible to prevent an assembly defect caused by the warpage of the optical filter.

A conventional optical filter had a thick near-IR layer having a dielectric multilayer film structure such that light with a wavelength of 700 nm or more was able to be shielded. However, the conventional optical filter had insufficient performance in shielding light in the range of 800 to 1,000 nm, and due to the thick dielectric multilayer film, it had ghosting or was difficult to be manufactured thinner so that it was not able to realize a small imaging device including the optical filter. However, as the optical filter according to the present invention includes the transparent base 10, that is, the optical article according to the present invention, including the base layer 12 and one or more types of near-infrared absorbing dyes 11 absorbing near-infrared rays, light with a wavelength of 800 nm or more may be effectively shielded. Therefore, by reducing the number of stacked layers and thickness of each of the selective wavelength reflection layers 20 and 30 to the above-mentioned ranges, ghosting is improved, and the optical filter 10 is easily formed to be thin. Moreover, as the number of stacked layers and thickness of the selective wavelength reflection layer are controlled, warpage of the optical filter which may occur in the manufacture of the optical filter may be reduced.

<Solid-State Imaging Device>

Further, in an exemplary embodiment of the present invention, an imaging device including the optical filter is provided.

The imaging device according to the present invention includes the optical filter of the present invention which includes an optical article containing a first dye having the absorption maximum in the wavelength range of 650 to 750 nm and a second dye having the absorption maximum in the wavelength range of 830 to 980 nm such that high transmittance is exhibited with respect to light with a wavelength in the visible light range, and as the transmittance with respect to light in the wavelength range of 800 to 1,000 nm is suppressed to 0.6% or less, ghosting occurring in imaging may be inhibited and the thickness of each selective wavelength reflection layer included in the optical filter may be reduced, and therefore there are advantages of facilitating a thin optical filter and a small imaging device. Moreover, since warpage occurring in the manufacture of the optical filter is reduced, an assembly defect rate in an assembly process may be reduced, leading to improvement in yield and productivity.

Therefore, the solid-state imaging element may be effectively used in electronic instruments to which a solid-state imaging device is applied, for example, a digital still camera, a camera for a mobile phone, a digital video camera, a PC camera, a security camera, a camera for an automobile, a personal digital assistant, a personal computer, a video game, a medical device, an USB memory, a portable game machine, a fingerprint identification system, a digital music player, etc.

Hereinafter, the present invention will be described in further detail with reference to preparation examples, examples and experimental examples.

However, the following preparation examples, examples and experimental examples are merely provided to exemplify the present invention, and the description of the present invention is not limited to the following preparation examples, examples and experimental examples.

Preparation Examples 1 to 4

According to a preparation example of the present invention, an optical article having first and second absorption peaks was prepared as follows.

A near-infrared absorbent A and a near-infrared absorbent B, which had absorption maximums in the wavelength ranges of 702±5 nm and 905±5 nm, respectively, were mixed at contents shown in Table 1 below with respect to 100 parts by weight of a resin. At this time, as the resin, a polymethylmethacrylate (PMMA) resin was used, and as an organic solvent, cyclohexanone was used. Afterward, the resulting mixture was stirred using a stirrer for 24 hours or more, thereby preparing a near-infrared absorbing solution. The prepared near-infrared absorbing solution was applied to both surfaces of a polyethylene terephthalate (PET) film (A4100, manufactured by Toyobo Co., Ltd.) having a thickness of 0.1 mm, cured at 120° C. for 50 minutes, thereby preparing an optical article having near-infrared absorbing layers on both surfaces thereof as shown in FIG. 1B. At this time, as the near-infrared absorbent A and the near-infrared absorbent B, which had absorption maximums in the wavelength ranges of 702±5 nm and 905±5 nm, respectively, near-infrared absorbing dyes represented by Formulas 1 and 2 were used.

TABLE 1

| | First absorption peak | | | Second absorption peak | | |
|---|---|---|---|---|---|---|
| | Name of absorbent | Content | OD1 | Name of absorbent | Content | OD2 |
| Preparation Example 1 | A | 1.0 part by weight | 1.00 | B | 3.6 parts by weight | 0.35 |
| Preparation Example 2 | A | 1.0 part by weight | 1.00 | B | 1.9 parts by weight | 0.21 |
| Preparation Example 3 | A | 1.0 part by weight | 1.00 | B | 1.0 part by weight | 0.10 |
| Preparation Example 4 | A | 1.0 part by weight | 1.00 | B | 0.4 part by weight | 0.04 |

To evaluate an optical density (OD) of each of the optical articles prepared according to Preparation Examples 1 to 4 according to the present invention, an absorption spectrum according to a wavelength in the wavelength range of 380 to 1,200 nm was measured using a spectrophotometer. From the measured optical density result, an optical density at the absorption maximum of a peak having the absorption maximum in the wavelength range of 650 to 750 nm (first absorption peak) and an optical density at the absorption maximum of a peak having the absorption maximum in the wavelength range of 830 to 980 nm (second absorption peak) were deduced, an optical density value (OD2) at the absorption maximum of the second absorption peak when the optical density curve was normalized for an optical density value (OD1) at the absorption maximum of the first absorption peak to be 1 was calculated. The result is shown in Table 1. In addition, the optical density curves for the optical articles according to the preparation examples shown in Table 1, respectively, are shown in FIG. 4. Referring to Table 1 and FIG. 4, it can be seen that the optical density OD2 ranges from 0.04 to 0.35.

Examples 1 to 7

A first selective wavelength reflection layer having a dielectric multilayer film structure was formed by alternately depositing $SiO_2$ and $Ti_3O_5$ on a first main surface of each of the optical articles prepared in Preparation Examples 1 to 4 at 110±5° C. using an E-beam evaporator. Afterward, a second selective wavelength reflection layer having a dielectric multilayer film structure was formed by alternately depositing $SiO_2$ and $Ti_3O_5$ on a second main surface of each of the optical articles at 110±5° C. using an E-beam evaporator, resulting in an optical filter having the same structure as shown in FIG. 2C. At this time, the number of stacked layers and thickness of each of the first and second selective wavelength reflection layers are shown in Table 2 below. At this time, the thickness means the total thickness of the first or second selective wavelength reflection layer, and the unit is a micrometer (μm).

TABLE 2

| Example No. | Optical article used | First selective wavelength reflection layer | | Second selective wavelength reflection layer | | [Equation 3] \|D1/D2\| | [Equation 4] \|P1 − P2\| |
|---|---|---|---|---|---|---|---|
| | | Layer number [P1] | Thickness [D1] | Layer number [P2] | Thickness [D2] | | |
| Example 1 | Preparation Example 1 | 23 | 2.8 | 28 | 3.4 | 0.82 | 5 |
| Example 2 | Preparation Example 1 | 23 | 2.8 | 26 | 3.1 | 0.90 | 3 |
| Example 3 | Preparation Example 1 | 28 | 3.5 | 28 | 3.4 | 1.03 | 0 |
| Example 4 | Preparation Example 1 | 31 | 3.9 | 28 | 3.4 | 1.15 | 3 |
| Example 5 | Preparation Example 2 | 23 | 2.8 | 26 | 3.1 | 0.90 | 3 |
| Example 6 | Preparation Example 3 | 23 | 2.8 | 26 | 3.1 | 0.90 | 3 |
| Example 7 | Preparation Example 4 | 23 | 2.8 | 26 | 3.1 | 0.90 | 3 |

Referring to Table 2, it can be seen that, in Examples 1 to 7, the \|D1/D2\| values according to [Equation 3] in the specification correspond to 0.8 to 1.2, and specifically, 0.82 to 1.15. In addition, it can be seen that, in Examples 1 to 7, the \|P1−P2\| values according to [Equation 4] in the specification correspond to 0 to less than 6, and specifically 0 to 5.

The first and second selective wavelength reflection layers may have, for example, a structure in which $SiO_2$ and $Ti_3O_5$ are alternately stacked. The first selective wavelength reflection layer may have a 23- to 31-layered structure and a thickness ranging from 2.8 to 3.9 μm. The second selective wavelength reflection layer may have a 26- to 28-layered structure and a thickness ranging from 3.1 to 3.4 μm. As examples of the first selective wavelength reflection layer and the second selective wavelength reflection layer of the optical filter, the stacked structure and thickness of each layer of the first selective wavelength reflection layer and the second selective wavelength reflection layer applied to Example 1 are shown in Tables 3 and 4 below.

TABLE 3

| Stacking sequence | Material | Optical thickness (QWOT) | Thickness (nm) |
|---|---|---|---|
| 1 | $SiO_2$ | 1.34 | 105.6 |
| 2 | $Ti_3O_5$ | 0.18 | 8.6 |
| 3 | $SiO_2$ | 0.48 | 38.2 |
| 4 | $Ti_3O_5$ | 2.17 | 104.6 |
| 5 | $SiO_2$ | 2.10 | 165.3 |
| 6 | $Ti_3O_5$ | 2.16 | 104.1 |
| 7 | $SiO_2$ | 2.16 | 170.2 |
| 8 | $Ti_3O_5$ | 2.20 | 106.1 |
| 9 | $SiO_2$ | 2.17 | 170.8 |
| 10 | $Ti_3O_5$ | 2.19 | 106.0 |
| 11 | $SiO_2$ | 2.18 | 171.7 |
| 12 | $Ti_3O_5$ | 2.20 | 106.5 |
| 13 | $SiO_2$ | 2.17 | 171.1 |
| 14 | $Ti_3O_5$ | 2.20 | 106.3 |
| 15 | $SiO_2$ | 2.18 | 171.5 |
| 16 | $Ti_3O_5$ | 2.19 | 106.0 |
| 17 | $SiO_2$ | 2.16 | 170.1 |
| 18 | $Ti_3O_5$ | 2.18 | 105.2 |
| 19 | $SiO_2$ | 2.14 | 168.6 |
| 20 | $Ti_3O_5$ | 2.12 | 102.2 |
| 21 | $SiO_2$ | 2.05 | 161.2 |
| 22 | $Ti_3O_5$ | 2.00 | 96.4 |
| 23 | $SiO_2$ | 0.98 | 77.2 |

TABLE 4

| Stacking sequence | Material | Optical thickness (QWOT) | Thickness (nm) |
|---|---|---|---|
| 1 | $SiO_2$ | 0.63 | 88.7 |
| 2 | $Ti_3O_5$ | 1.20 | 107.0 |
| 3 | $SiO_2$ | 1.38 | 194.8 |
| 4 | $Ti_3O_5$ | 1.37 | 122.9 |
| 5 | $SiO_2$ | 1.48 | 208.9 |
| 6 | $Ti_3O_5$ | 0.17 | 15.2 |
| 7 | $SiO_2$ | 0.10 | 14.3 |
| 8 | $Ti_3O_5$ | 1.31 | 116.3 |
| 9 | $SiO_2$ | 1.39 | 197.2 |
| 10 | $Ti_3O_5$ | 1.21 | 108.7 |
| 11 | $SiO_2$ | 1.23 | 173.9 |
| 12 | $Ti_3O_5$ | 1.14 | 102.3 |
| 13 | $SiO_2$ | 1.21 | 170.9 |
| 14 | $Ti_3O_5$ | 1.12 | 100.5 |
| 15 | $SiO_2$ | 1.21 | 170.8 |
| 16 | $Ti_3O_5$ | 1.11 | 99.2 |
| 17 | $SiO_2$ | 1.21 | 171.0 |
| 18 | $Ti_3O_5$ | 1.11 | 99.3 |
| 19 | $SiO_2$ | 1.21 | 170.8 |
| 20 | $Ti_3O_5$ | 1.11 | 99.8 |
| 21 | $SiO_2$ | 1.21 | 171.1 |
| 22 | $Ti_3O_5$ | 1.13 | 101.1 |
| 23 | $SiO_2$ | 1.22 | 172.9 |
| 24 | $Ti_3O_5$ | 1.16 | 103.8 |
| 25 | $SiO_2$ | 1.30 | 183.4 |
| 26 | $Ti_3O_5$ | 1.28 | 114.5 |
| 27 | $SiO_2$ | 0.28 | 39.9 |
| 28 | $Ti_3O_5$ | 0.11 | 9.8 |

In addition, the spectral transmittance for the first selective wavelength reflection layer shown in Table 3 is shown in FIG. 5, and the spectral transmittance for the second selective wavelength reflection layer shown in Table 4 is shown in FIG. 6.

Comparative Preparation Examples 1 to 3

Optical articles according to Comparative Preparation Examples 1 to 3 were prepared in substantially the same manner as described in Preparation Examples 1 to 4, with the exception of contents of a near-infrared absorbent A having the absorption maximum in the wavelength range of 702±5 nm and a near-infrared absorbent B having the absorption maximum in the wavelength range of 905±5 nm. At this time, the contents of the near-infrared absorbent A and near-infrared absorbent B are shown in Table 5 below.

TABLE 5

|  | First absorption peak | | | Second absorption peak | | |
| --- | --- | --- | --- | --- | --- | --- |
|  | Name of absorbent | Content | OD1 | Name of absorbent | Content | OD2 |
| Comparative Preparation Example 1 | A | 1.0 part by weight | 1.00 | B | 0.0 parts by weight | 0.00 |
| Comparative Preparation Example 2 | A | 1.0 part by weight | 1.00 | B | 5.4 parts by weight | 0.60 |
| Comparative Preparation Example 3 | A | 1.0 part by weight | 1.00 | B | 0.2 part by weight | 0.02 |

Optical density values of the optical articles according to Comparative Preparation Examples 1 to 3 were calculated by substantially the same method as the above-described method of measuring an optical density of the optical article according to Preparation Examples 1 to 4. The result is shown in Table 5. Moreover, the optical density curve for each of the optical articles according to Comparative Preparation Examples 1 to 3 shown in Table 5 is shown in FIG. 4. Referring to Table 5 and FIG. 5, it can be seen that the optical density value OD2 is outside the range from 0.04 to 0.35.

Comparative Examples 1 to 6

A first selective wavelength reflection layer having a dielectric multilayer film structure was formed by alternately depositing $SiO_2$ and $Ti_3O_5$ on a first main surface of each of the optical articles prepared in Comparative Preparation Examples 1 to 3 at 110±5° C. using an E-beam evaporator. Afterward, a second selective wavelength reflection layer having a dielectric multilayer film structure was formed by alternately depositing $SiO_2$ and $Ti_3O_5$ on a second main surface of each of the optical articles at 110±5° C. using an E-beam evaporator, resulting in an optical filter having the same structure shown in FIG. 2C. At this time, the number of stacked layers and thickness of each of the first and second selective wavelength reflection layers are shown in Table 6 below. At this time, the thickness means the total thickness of each of the first and second selective wavelength reflection layers, and the unit is a micrometer (μm).

TABLE 6

|  |  | First selective wavelength reflection layer | | Second selective wavelength reflection layer | | | |
| --- | --- | --- | --- | --- | --- | --- | --- |
| Comparative Example No. | Optical article used | Layer number [P1] | Thickness [D1] | Layer number [P2] | Thickness [D2] | [Equation 3] \|D1/D2\| | [Equation 4] \|P1 − P2\| |
| Comparative Example 1 | Comparative Preparation Example 1 | 23 | 2.8 | 30 | 3.6 | 0.78 | 7 |
| Comparative Example 2 | Comparative Preparation Example 1 | 23 | 2.8 | 32 | 3.8 | 0.74 | 9 |
| Comparative Example 3 | Comparative Preparation Example 1 | 31 | 3.9 | 26 | 3.1 | 1.26 | 5 |
| Comparative Example 4 | Comparative Preparation Example 1 | 23 | 2.8 | 26 | 3.1 | 0.90 | 3 |
| Comparative Example 5 | Comparative Preparation Example 2 | 23 | 2.8 | 26 | 3.1 | 0.90 | 3 |
| Comparative Example 6 | Comparative Preparation Example 3 | 23 | 2.8 | 26 | 3.1 | 0.90 | 3 |

Referring to Table 6, it can be seen that, in Comparative Examples 1 to 3, the |D1/D2| values according to [Equation 3] in the specification are outside the range from 0.8 to 1.2. In addition, it can be seen that, in Comparative Examples 1 and 2, the |P1−P2| values according to [Equation 4] of the specification are outside the range from 0 to 6.

Experimental Example 1

To evaluate the transmittance according to an incident angle of the optical filter according to the present invention, an experiment was performed as follows.

The transmission spectrum for each of the optical filters prepared in Examples 2, 5 to 7 and Comparative Examples 4 to 6 was measured using a spectrophotometer in the wavelength range of 380 to 1,200 nm.

The transmittances of the visible light and near-infrared rays according to an incident angle were deduced by measuring the transmittances with respect to light (incident angle: 0°) incident in a vertical direction on the optical filter and light (incident angle: 30°) incident in a direction having 30° from the direction perpendicular to the optical filter. The result is shown in Table 7 and FIGS. 7 to 10. At this time, the average transmittance for the visible light refers to a calculated average value of the transmittance per wavelength in the wavelength range of 430 to 565 nm, the average transmittance for the near-infrared rays means a calculated average value of the transmittance per wavelength in the wavelength range of 800 to 1,000 nm, and the maximum transmittance for the near-infrared rays means the maximum value of the transmittance in the wavelength range of 800 to 1,000 nm.

In addition, Table 7 shows an optical density OD2 for each of the optical articles used in Examples 2, 5 to 7 and Comparative Examples 4 to 6.

and an incident angle of 30°, the optical filters prepared in Examples 2 and 5 to 7 exhibited very low maximum transmittances of 0.1% or less and 0.6% or less, respectively. On the other hand, the optical filter of Comparative Example 4 using an optical article having an optical density value OD2 of 0.00 and the optical filter of Comparative Example 6 using an optical article having an optical density value OD2 of 0.02 had a maximum transmittance with respect to light with an incident angle of 30° of more than 0.6%. When the maximum transmittance exceeded 0.6%, there is a high likelihood that ghosting occurs during imaging under outdoor natural light or indoor light.

In addition, referring to Table l and FIGS. 7 to 10, when light in the visible light range, that is, the wavelength range of 430 to 565 nm is incident at an angle of 0°, the optical filters prepared Examples 2 and 5 to 7 exhibited an average transmittance of 80% or more. Particularly, when light is incident at an angle of 30°, it was confirmed that an average transmittance is 70% or more. However, in the optical filter of Comparative Example 5 using an optical article having an optical density OD2 of 0.60, it was confirmed that an average transmittance of light incident at an angle of 30° was less than 70%. When transmittance in the visible light range is decreased to 70% or less, there is a high likelihood that ghosting occurs during imaging.

From the above result, it can be seen that the optical filter according to the present invention can have an excellent transmittance with respect to light in the visible light range, and effectively shield light with a wavelength of 800 nm or more.

Moreover, it can be seen that the optical filter using an optical article according to the present invention having an optical density value OD2 of 0.03 to 0.36 provides excellent

TABLE 7

| Optical filter | Optical article used | OD2 | Incident angle 0° | | | Incident angle 30° | | |
| --- | --- | --- | --- | --- | --- | --- | --- | --- |
| | | | Average transmittance for visible light [%] | Maximum transmittance for near-infrared rays [%] | Average transmittance for near-infrared rays [%] | Average transmittance for visible light [%] | Maximum transmittance for near-infrared rays [%] | Average transmittance for near-infrared rays [%] |
| Example 2 | Preparation Example 1 | 0.35 | 80.38 | 0.07 | 0.01 | 71.28 | 0.09 | 0.03 |
| Example 5 | Preparation Example 2 | 0.21 | 87.67 | 0.08 | 0.02 | 81.70 | 0.23 | 0.06 |
| Example 6 | Preparation Example 3 | 0.10 | 90.76 | 0.09 | 0.02 | 86.41 | 0.38 | 0.09 |
| Example 7 | Preparation Example 4 | 0.04 | 92.87 | 0.09 | 0.03 | 89.67 | 0.54 | 0.12 |
| Comparative Example 4 | Comparative Preparation Example 1 | 0.00 | 94.59 | 0.09 | 0.03 | 92.37 | 0.71 | 0.15 |
| Comparative Example 5 | Comparative Preparation Example 2 | 0.60 | 74.19 | 0.06 | 0.01 | 62.65 | 0.04 | 0.01 |
| Comparative Example 6 | Comparative Preparation Example 3 | 0.02 | 93.75 | 0.09 | 0.03 | 91.04 | 0.62 | 0.13 |

As shown in Table 7 and FIGS. 7 to 10, it can be seen that the optical filter according to the present invention has excellent transmittance with respect to light in the visible light range, and effectively shields light with a wavelength of 800 nm or more.

Specifically, referring to Table 7, when light in the wavelength range of 800 to 1,000 nm is incident at an angle of 0°, performance in shielding light with a wavelength of 800 nm or more as well as high transmittance of visible light.

Experimental Example 2

To evaluate a degree of warpage of the optical filter according to the present invention, an experiment was performed as follows.

Using the Ultrahigh Accurate 3-D Profilometer (UA3P-300, Panasonic Corporation), the warpage degree and warpage direction of the optical filters (width (3 mm)×length (3 mm)) prepared in Examples 1 to 4 and Comparative Examples 1 to 3 were measured. Specifically, the first selective wavelength reflection layer of each optical filter was fixed to be in contact with the horizontal surface of the profilometer, and heights of points present on the surface of the fixed optical filter based on the horizontal surface were measured. At this time, the temperature of a chamber in which the optical filter was fixed was 23° C., a relative humidity was 60%, and vibration acceleration was 0.5 cm/s², and the measurement result is shown in Table 8 below.

TABLE 8

| Optical filter | |D1/D2| | |P1-P2| | Warpage degree (μm) | Assembly defect rate (%) |
|---|---|---|---|---|
| Example 1 | 0.82 | 5 | 7.0 | 0 |
| Example 2 | 0.90 | 3 | 4.2 | 0 |
| Example 3 | 1.03 | 0 | 0.0 | 0 |
| Example 4 | 1.15 | 3 | -4.9 | 0 |
| Comparative Example 1 | 0.78 | 7 | 10.4 | 4 |
| Comparative Example 2 | 0.74 | 9 | 13.9 | 7 |
| Comparative Example 3 | 1.26 | 5 | -7.2 | 1 |

Referring to Table 8, it can be seen that the optical filter according to the present invention can reduce warpage by controlling the number of stacked layers and thickness of the selective wavelength reflection layer.

Specifically, it was seen that the optical filters of Examples 1 to 4, which had a deviation (|P1-P2|) in the number of stacked layers between the first and second selective wavelength reflection layers formed on the surface of the optical article of less than 6 layers; a thickness ratio (D1/D2) of more than 0.8 and less than 1.2, exhibited a warpage degree of approximately 7.0 μm or less regardless of a direction.

On the other hand, it was confirmed that the optical filters of Comparative Examples 1 to 3 which had a deviation (|P1-P2|) in the number of stacked layers between the first and second selective wavelength reflection layers of more than 6 layers; and a thickness ratio (D1/D2) of less than 0.8 or more than 1.2 had a great warpage degree of more than 7.0 μm.

In addition, Table 8 shows assembly defect rates in an assembly process when the optical filters (width 5.7 mm×length 4.6 mm) prepared in Examples 1 to 4 and Comparative Examples 1 to 3 were assembled in an imaging device. As a result of measuring the warpage degree shown in Table 8, when the warpage degree exceeded 7.0 μm, it can be seen that the defect rate is increased in the assembly process. Such a result shows that, as the deviation in the numbers of stacked layers and the thickness ratio between the first and second selective wavelength reflection layers formed on the surface of the optical article were controlled, the warpage of the optical filter may be reduced, and the assembly defect rate in the process of assembling an imaging device may be reduced, resulting in improvement in yield and productivity.

Experimental Example 3

To evaluate an image quality of the optical filter according to the present invention, an experiment was performed as follows.

An image was taken using an imaging device manufactured using a camera module equipped with the optical filter according to Example 7 of the present invention. In addition, for comparative evaluation with respect to image quality, using an imaging device which has a lens and an image sensor of the camera module and the optical filter according to Comparative Example 6 of the present invention, the same object as used in the previous imaging was photographed. The images of the indoor light are shown in FIG. 11. In FIG. 11B, the image taken by the imaging device equipped with the optical filter according to Comparative Example 6 shows strong ghosting in the lower region in the middle of the image. On the other hand, referring to FIG. 11A, the image taken by the imaging device equipped with the optical filter according to Example 7 of the present invention does not show ghosting.

Therefore, the optical filter according to the present invention may exhibit high transmittance with respect to light with a wavelength in the visible light range, and may prevent ghosting by suppressing a transmittance with respect to light in a wavelength range of 800 to 1,000 nm to 0.6% or less. In addition, as warpage of the optical filter may be effectively reduced by controlling the number of stacked layers and thickness of a selective wavelength reflection layer, an assembly defect rate caused by the warpage of the optical filter in a process of assembling an imaging device may be considerably reduced.

The invention claimed is:

1. An optical article comprising:
a transparent base containing one or more near-infrared absorbing dyes, and
wherein an absorption spectrum measured using a spectrophotometer in a wavelength range of 380 to 1,200 nm has two or more absorption peaks including first and second absorption peaks as below,
the first absorption peak has an absorption maximum ($\mu$max1) in a wavelength range of 650 to 750 nm,
the second absorption peak has an absorption maximum ($\mu$max2) in a wavelength range of 830 to 980 nm, and
when an optical density value (OD1) at the absorption maximum of the first absorption peak is normalized to be 1, an optical density value (OD2) at the absorption maximum of the second absorption peak satisfies the following Equation 1:

$$0.03 < OD2 < 0.36 \qquad \text{[Equation 1]};$$

wherein the optical article comprises
a first selective wavelength reflection layer formed on a first main surface of the transparent base; and
a second selective wavelength reflection layer formed on a second main surface of the transparent base, and satisfies the following Equation 3:

$$0.8 < D1/D2 < 1.2 \qquad \text{[Equation 3]}$$

in Equation 3,
D1 represents a thickness of the first selective wavelength reflection layer, and
D2 represents a thickness of the second selective wavelength reflection layer; and
wherein the first and second selective wavelength reflection layers are each independently formed of a dielectric multilayer film, and satisfy the following Equation 4:

$$0 \leq |P1-P2| < 6 \qquad \text{[Equation 4]}$$

in Equation 4,

P1 represents the number of stacked layers of the dielectric multilayer film constituting the first selective wavelength reflection layer, and P2 represents the number of stacked layers of the dielectric multilayer film constituting the second selective wavelength reflection layer.

2. The optical article according to claim 1, wherein the optical density value (OD2) at the absorption maximum of the second absorption peak satisfies the following Equation 2:

$$0.18 \leq OD2 \leq 0.35. \qquad \text{[Equation 2]}$$

3. The optical article according to claim 1, wherein the transparent base includes at least one of glass and a polymer resin.

4. The optical article according to claim 3, wherein the polymer resin includes one or more selected from the group consisting of a polyester-based resin, a polycarbonate-based resin, an acryl-based resin, a polyolefin-based resin, a cyclic olefin-based resin, a polyimide-based resin, a polyamide-based resin, and a polyurethane-based resin.

5. The optical article according to claim 1, wherein the near-infrared absorbing dyes include a first dye having the absorption maximum in the range of 650 to 750 nm; and a second dye having the absorption maximum in the range of 830 to 980 nm.

6. The optical article according to claim 1, wherein the near-infrared absorbing dyes include any one or more of compounds represented by the following Formulas 1 and 2:

[Formula 1]

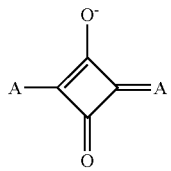

[Formula 2]

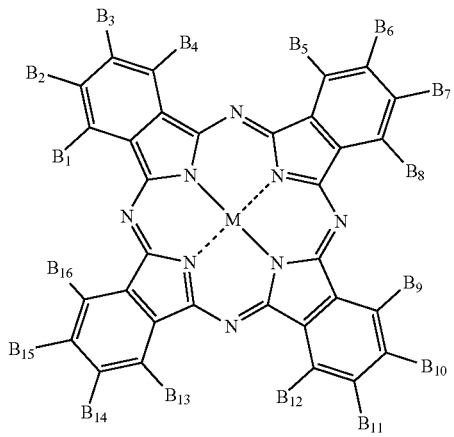

in Formulas 1 and 2,

A is an aminophenyl group; an indolylmethylene group; or an indolinyl group, two As are conjugated with each other with

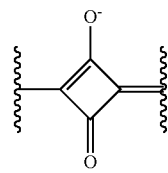 [SMILES: *C1=C([O-])C(=*)C1=O]

as a center, any one or more of hydrogens present in the aminophenyl, indolylmethylene or indolinyl group may be unsubstituted or substituted with hydrogen, a halogen element, a hydroxyl group, a cyano group, a nitro group, a carboxyl group, an alkyl group having 1 to 20 carbon atoms, a cycloalkyl group having 3 to 20 carbon atoms, an alkoxy group having 1 to 10 carbon atoms, an aralkyl group having 7 to 20 carbon atoms, a sulfonamide group, or an amide group unsubstituted or substituted with an alkyl group having 1 to 4 carbon atoms, a haloalkyl group having 1 to 4 carbon atoms or an aralkyl group having 7 to 20 carbon atoms;

$B_1, B_2, B_3, B_4, B_5, B_6, B_7, B_8, B_9, B_{10}, B_{11}, B_{12}, B_{13}, B_{14}, B_{15}$ and $B_{16}$ are each independently hydrogen, a halogen element, a hydroxyl group, a cyano group, a nitro group, a carboxyl group, a phenoxy group, a phenylsulfanyl group, an alkyl group having 1 to 20 carbon atoms, a cycloalkyl group having 3 to 20 carbon atoms, an alkoxy group having 1 to 10 carbon atoms, an alkylamine group having 1 to 10 carbon atoms or an aralkyl group having 7 to 20 carbon atoms, any one or more of the hydrogens present in the phenoxy group, the phenylsulfanyl group, the alkyl group having 1 to 20 carbon atoms, the cycloalkyl group having 3 to 20 carbon atoms, the alkoxy group having 1 to 10 carbon atoms, the alkylamine group having 1 to 10 carbon atoms or the aralkyl group having 7 to 20 carbon atoms may be unsubstituted or substituted with a halogen element, a hydroxyl group, a cyano group, an aminophenyl group, a phenoxy group, a phenylsulfanyl group, an indole group, an indolinyl group, a pyridinyl group, an alkyl group having 1 to 10 carbon atoms, a haloalkyl group having 1 to 6 carbon atoms or an aralkyl group having 7 to 20 carbon atoms; and M is copper, zinc, nickel, titanium, vanadium, indium, gallium, platinum, silicon, oxotitanium or oxovanadium.

7. The optical article according to claim 1, wherein the transparent base comprises a base layer; and a near-infrared absorbing layer formed on one or both surfaces of the base layer and containing near-infrared absorbing dyes.

8. The optical article according to claim 1, wherein the transparent base comprises a base layer; and near-infrared absorbing dyes dispersed in the base layer.

9. An optical filter comprising the optical article according to claim 1.

10. An optical filter comprising:

a transparent base containing one or more near-infrared absorbing dyes; and a selective wavelength reflection layer formed on one or both surfaces of the transparent base, and which satisfies the following conditions (A) and (B) in measurement of a transmission spectrum using a spectrophotometer in a wavelength range of 380 to 1,200 nm:

(A) in a wavelength range of 800 to 1,000 nm, a maximum transmittance with respect to light incident in a vertical direction of the optical filter is 0.3% or less; and
(B) in the wavelength range of 800 to 1,000 nm, a maximum transmittance with respect to light incident in a direction having an angle of 30° with respect to the direction perpendicular to the optical filter is 0.6% or less;

wherein the optical filter comprises a first selective wavelength reflection layer formed on a first main surface of the transparent base; and a second selective wavelength reflection layer formed on a second main surface of the transparent base, and satisfies the following Equation 3:

$$0.8 < D1/D2 < 1.2 \quad \text{[Equation 3]}$$

in Equation 3,

D1 represents a thickness of the first selective wavelength reflection layer, and D2 represents a thickness of the second selective wavelength reflection layer; and wherein the first and second selective wavelength reflection layers are each independently formed of a dielectric multilayer film, and satisfy the following Equation 4:

$$0 \leq |P1 - P2| < 6 \quad \text{[Equation 4]}$$

in Equation 4,

P1 represents the number of stacked layers of the dielectric multilayer film constituting the first selective wavelength reflection layer, and P2 represents the number of stacked layers of the dielectric multilayer film constituting the second selective wavelength reflection layer.

11. The optical filter according to claim 10, wherein the transparent base has two or more absorption peaks including first and second absorption peaks as below when an absorption spectrum measured using a spectrophotometer in the wavelength range of 380 to 1,200 nm, the first absorption peak has an absorption maximum ($\lambda$max1) in the wavelength range of 650 to 750 nm, the second absorption peak has an absorption maximum ($\lambda$max2) in the wavelength range of 830 to 980 nm, and when an optical density value (OD1) at the absorption maximum of the first absorption peak is normalized to be 1, an optical density value (OD2) at the absorption maximum of the second absorption peak satisfies the following Equation 1:

$$0.03 < OD2 < 0.36. \quad \text{[Equation 1]}$$

12. A solid-state imaging device comprising the optical filter according to claim 10.

* * * * *